(12) United States Patent
Takano et al.

(10) Patent No.: US 6,788,601 B2
(45) Date of Patent: Sep. 7, 2004

(54) SEMICONDUCTOR MEMORY DEVICE AND CURRENT MIRROR CIRCUIT

(75) Inventors: Yoshinori Takano, Tokyo (JP); Shigeru Atsumi, Yokohama (JP); Toru Tanzawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/305,785

(22) Filed: Nov. 26, 2002

(65) Prior Publication Data

US 2004/0062116 A1 Apr. 1, 2004

(30) Foreign Application Priority Data

Dec. 4, 2001 (JP) ........................................ 2001-370504

(51) Int. Cl.[7] .................................................. G11C 7/02
(52) U.S. Cl. ............. 365/207; 365/189.07; 365/189.09; 365/210; 365/226
(58) Field of Search ........................... 365/207, 189.07, 365/189.09, 210, 226

(56) References Cited

U.S. PATENT DOCUMENTS

| | | | |
|---|---|---|---|
| 6,233,189 B1 | 5/2001 | Tanzawa et al. | ............ 365/207 |
| 6,504,778 B1 * | 1/2003 | Uekubo | ........................ 365/207 |
| 6,567,330 B2 * | 5/2003 | Fujita et al. | ................. 365/210 |

FOREIGN PATENT DOCUMENTS

JP            2000-35394        12/2000

OTHER PUBLICATIONS

Shigeru Atsumi et al., "A Channel–Erasing 1.8–V–Only 32–Mb NOR Flash EEPROM with a Bitline Direct Sensing Scheme", IEEE Journal of Solid–State Circuits, vol. 35, No. 11, Nov. 2000. pp 1648–1653.

Shigeru Atsumi et al., "A Channel–Erasing 1.8V–Only 32Mb NOR Flash EEPROM with a Bitline Direct Sensing Scheme", ISSCC 200, Session 16, Non–Volatile and SRAM. Paper TP 16.7, Digest of Technical Papers, pp 276–277.

* cited by examiner

Primary Examiner—Van Thu Nguyen
Assistant Examiner—Pho M. Luu
(74) Attorney, Agent, or Firm—Hogan & Hartson, LLP

(57) ABSTRACT

A semiconductor memory device comprises memory cell array, a sense amp, and a reference voltage generator.

The reference voltage generator includes a reference cell unit containing a reference cell to flow a reference current and a first current source load to supply a current to the reference cell; a reference transistor unit containing a reference transistor to flow a current reflecting the reference current and a second current source load to supply a current to the reference transistor; a control amp for negative feedback control of the reference transistor; a current source transistor; and a third current source load connected to a reference sense line.

16 Claims, 11 Drawing Sheets

SEMICONDUCTOR MEMORY DEVICE AND CURRENT MIRROR CIRCUIT

CROSS REFERENCE TO RELATED APPLICATION

This application is based upon and claims the benefit of priority from the prior Japanese Patent Application No. 2001-370504, filed on Dec. 4, 2001; the entire contents of which are incorporated herein by reference.

BACKGROUND OF THE INVENTION

1. Field of the Invention

The present invention relates to a semiconductor memory device that stores data in accordance with the presence/absence or the magnitude of a current. More particularly it relates to an improvement in a sense amp circuitry operative to compare a potential on a data line with that on a reference data line for data sensing.

2. Description of the Related Art

An EEPROM is known as an electrically rewritable semiconductor memory device for nonvolatile storage of data. A type of EEPROM can erase multiple memory cells collectively at a time, which is called the flash memory. Such the semiconductor memory stores data in a memory cell in accordance with the presence/absence or the magnitude of a current flowing in it and accordingly employs a sense amp circuit of a current read-out type. A type of such the sense amp often employed compares a voltage caused on a data line based on data read out of a memory cell with a reference voltage on a reference voltage line for data determination.

FIG. 19 shows an arrangement of such the sense amp circuit in the art. A sense amp body 311 comprises a differential amp (opamp) OP. The differential amp OP has two input terminals connected to a sense line SN and a reference sense line RSN, respectively. The sense line SN is connected through a NMOS transistor QN1, or an isolator (clamper), to a data line DL that is led to a bit line BL from a selected memory cell MC. The isolator is located to suppress the drain voltage on the memory cell MC below a certain level. A PMOS transistor QP1, or a current source load, is also connected to the sense line SN. The PMOS transistor QP1 and the isolator NMOS transistor QN1 together configure a cascade amp 310.

To the reference sense line RSN, a reference voltage generator 320 is connected to generate a middle reference voltage between voltages appeared on the sense line SN based on data. The reference voltage generator 320 comprises a reference cell RMC having the same structure as that of the memory cell MC. It also comprises a current source NMOS transistor QN11, which reflects the current flowing through the reference cell RMC to flow a current that is half the current, Icell, flowing through an ON-cell (a cell in a state of data "1"). The current source NMOS transistor QN11 has a drain connected to the reference sense line RSN via the isolator transistor QN2, similar to the sense line SN. A current source load PMOS transistor QP2 is connected to the reference sense line RSN. The data line DL has a relatively large capacitance in general. Therefore, a dummy capacitor CR is connected to a reference data line RDL to match its capacitance with that of the data line DL.

The current path through the reference cell RMC configures a reference cell unit 320a, which includes the isolator NMOS transistor QN4 and the current source load PMOS transistor QP4 serially connected with the reference cell RMC. In order to transfer the reference current, I0, flowing through the reference cell RMC to the current source transistor QN11, the current path through the reference transistor QN10 configures a reference transistor unit 320b. It includes the isolator NMOS transistor QN3 and the current source load PMOS transistor QP3 serially connected with the current source transistor QN11. The current source PMOS transistor QP3 has a drain node N1 connected to a gate of the reference NMOS transistor QN10.

The PMOS transistors QP3 and QP4 configure a current mirror circuit. Accordingly, the current, I1, flowing through the reference transistor QN10 reflects the reference current, I0, flowing through the reference cell RMC. In accordance with a size ratio between the PMOS transistors QP3 and QP4, the current I1 has a constant ratio to the reference current I0. The reference NMOS transistor QN10 and the current source NMOS transistor QN11 also configure a current mirror circuit. Accordingly, a size ratio between them can be determined so that the current, I2, flowing through the current source transistor QN11 has a constant ratio to I1.

This reference voltage generator allows the current source transistor QN11 to flow a current, Icell/2, where Icell denotes a cell current flowing into a selected memory cell in an ON-cell state. As a result, when the sense amp 311 senses a difference between the voltage on the sense line SN and that on the reference sense line RSN, it is possible to determine whether the data is "1" or "0".

Such the conventional sense amp circuitry causes a problem associated with a lower supply voltage, which is described below. FIG. 20 shows voltage distributions in the sense amp circuit when a supply voltage is set to Vcc=2.7V and when Vcc is further lowered. To achieve a cell current necessary for a read operation, a bit line voltage is required to keep a minimum value of 0.5V. A difference in bit line amplitude between an OFF-cell and an ON-cell has an upper limit determined to 0.3V as required for suppressing the so-called soft-write (a little written phenomenon caused by the read operation). A current source load PMOS transistor is assumed to have a threshold value of Vtp=−0.8V. In this case, if Vcc=2.7V, a sense line amplitude is allowed to have a possible range of 1.1V.

Thus, it is possible to hold an operating voltage sufficient to configure the cascade amplifier as shown in FIG. 19 that includes the isolator interposed between the sense line SN and the data line DL. When lowered to Vcc=1.8V and if the bit line voltage minimum, the bit line amplitude possible range, and the voltage drop corresponding to the threshold value of the current source load PMOS transistor require to keep their voltages unchanged, the sense line amplitude possible range is reduced as shown in FIG. 20. In this case, it is impossible to hold an amplifying operation from the bit line to the sense line. When lowered to Vcc=1.5V, no operating margin can be held.

In consideration of such the situation, the Inventors et al. have previously proposed a bit-line direct-sensing scheme, as a preferable sense amp circuitry capable of responding to a supply voltage lowered below 2V, in which a sense node is connected directly to a data line without locating an isolator. (See: (1) Institute of Electronics, Information and Communication Engineers, Technical Report of IEICE, ICD 200-13; and (2) Atsumi S. et al., "A Channel-Erasing 1.8V-Only 32 Mb NOR Flash EEPROM with a Bit-Line Direct-Sensing Scheme", ISSCC 2000 Digest of Technical Papers, pp. 276–277 (2000.2)).

Even if the above bit-line direct-sensing scheme is applied, however, the conventional sense amp circuitry has another problem in the reference voltage generator, which prevents the supply voltage to be lowered. This problem is described using the reference voltage generator 320 in FIG. 19. In order to allow the gate node N3 of the current source transistor QN11 to be kept at a constant potential regardless of the power supply Vcc, the reference NMOS transistor QN10 is required to operate as a pentode. In consideration of this point, a minimum supply voltage, Vccmin, is examined, which allows the reference voltage generator 320 to operate. The isolator NMOS transistors QN3 and QN4 are not considered because they can be removed.

When a drain voltage of Vdn=0.8V is required for the reference cell RMC to flow a current through it, and the current source load transistor QP4 has a threshold voltage of Vtp=−1V, a minimum supply voltage, Vccmin1, at the reference cell unit 320a comes to Vccmin1=Vdn+|Vtp|= 1.8V.

In contrast, at the reference transistor unit 320b, the voltage on the node N1 required for the reference transistor QN11 to operate as a pentode is equal to Vdn+Vtn, where Vtn denotes a threshold voltage of the NMOS transistor QN10. To supply the necessary drain current to the NMOS transistor QN10, the current source PMOS transistor QP3 is also required to operate as a pentode, which causes a voltage drop equal to Vdp+|Vtp|, where Vdp denotes a voltage between the source and the drain. Accordingly, a minimum supply voltage, Vccmin2, at the reference transistor unit 320b comes to Vccmin2=Vdn+Vtn+Vdp+|Vtp|=1.8V+α, which is clearly larger than the minimum supply voltage, Vccmin1, at the reference cell unit 320a.

As obvious from the above, the conventional reference voltage generator is configured to limit a lower supply voltage because of the reference transistor unit 320b. In a word, even though the bit-line direct-sensing scheme is applied to the sense amp body as described above, the Vccmin can not be improved if the reference voltage generator remains as it is in the art.

The present invention has been made in consideration of such the situation and accordingly has an object to provide a semiconductor memory device using a sense amp circuitry capable of lowering a supply voltage easily.

SUMMARY OF THE INVENTION

A semiconductor memory device according to an aspect of the invention comprises an array of memory cells each configured to store data in accordance with the presence/ absence or the magnitude of a current; a sense amp configured to compare a voltage caused on a sense line based on data in a memory cell selected from the array of memory cells with a reference voltage applied to a reference sense line to determine the data; and a reference voltage generator configured to generate the reference voltage applied to the reference sense line. The reference voltage generator includes a reference cell unit containing a reference cell to flow a reference current as a reference for determination of data in the memory cell, and a first current source load to supply a current to the reference cell; a reference transistor unit containing a reference transistor to flow a current reflecting the reference current, and a second current source load to supply a current to the reference transistor; a control amp having a first input terminal connected to a first connection node between the reference cell and the first current source load, a second input terminal connected to a second connection node between the reference transistor and the second current source load, and an output terminal connected to a gate of the reference transistor to negative feedback control the reference transistor; a current source transistor having a gate commonly connected to the gate of the reference transistor, and a drain connected to the reference sense line from the sense amp; and a third current source load connected to the reference sense line.

According to this aspect of the invention, reflecting the current flowing through the reference cell, the reference voltage generator generates a current to be compared with the current read out of the selected memory cell to yield a reference voltage applied to the reference sense line. The reference voltage generator employs the control amp, instead of the conventional current mirror circuit, to control the reflected current to lower the supply voltage applied to the reference voltage generator.

A semiconductor memory device according to another aspect of the invention comprises an array of memory cells each configured to store data in accordance with the presence/absence or the magnitude of a current; a sense amp configured to compare a voltage caused on a sense line based on data in a memory cell selected from the array of memory cells with a reference voltage applied to a reference sense line to determine the data; and a reference voltage generator configured to generate the reference voltage applied to the reference sense line. The reference voltage generator includes a reference cell unit containing a reference cell to flow a reference current as a reference for determination of data in the memory cell, and a first current source load connected to an internal boosted-voltage source to supply a current to the reference cell; a reference transistor unit containing a reference transistor to flow a current reflecting the reference current, and a second current source load connected to the internal boosted-voltage source to supply a current to the reference transistor, the reference transistor having a gate connected to a connection node between the second current source load and the reference transistor; a current source transistor having a gate commonly connected to the gate of the reference transistor, and a drain connected to the reference sense line from the sense amp; and a third current source load connected to the reference sense line to supply a current to the current source transistor.

According to this aspect of the invention, the use of the internal boosted-voltage source in the reference voltage generator can prevent such an event that the reference voltage generator limits the supply voltage to be lowered. Therefore, it is possible to lower the supply voltage in accordance with the sense amp even if the same circuitry as the conventional type is employed in the reference voltage generator.

BRIEF DESCRIPTION OF THE DRAWINGS

The present invention will be more fully understood from the following detailed description with reference to the accompanying drawings, in which.

DETAILED DESCRIPTION OF THE INVENTION

Embodiments of the present invention will be described below with reference to the drawings.

Figure 1:
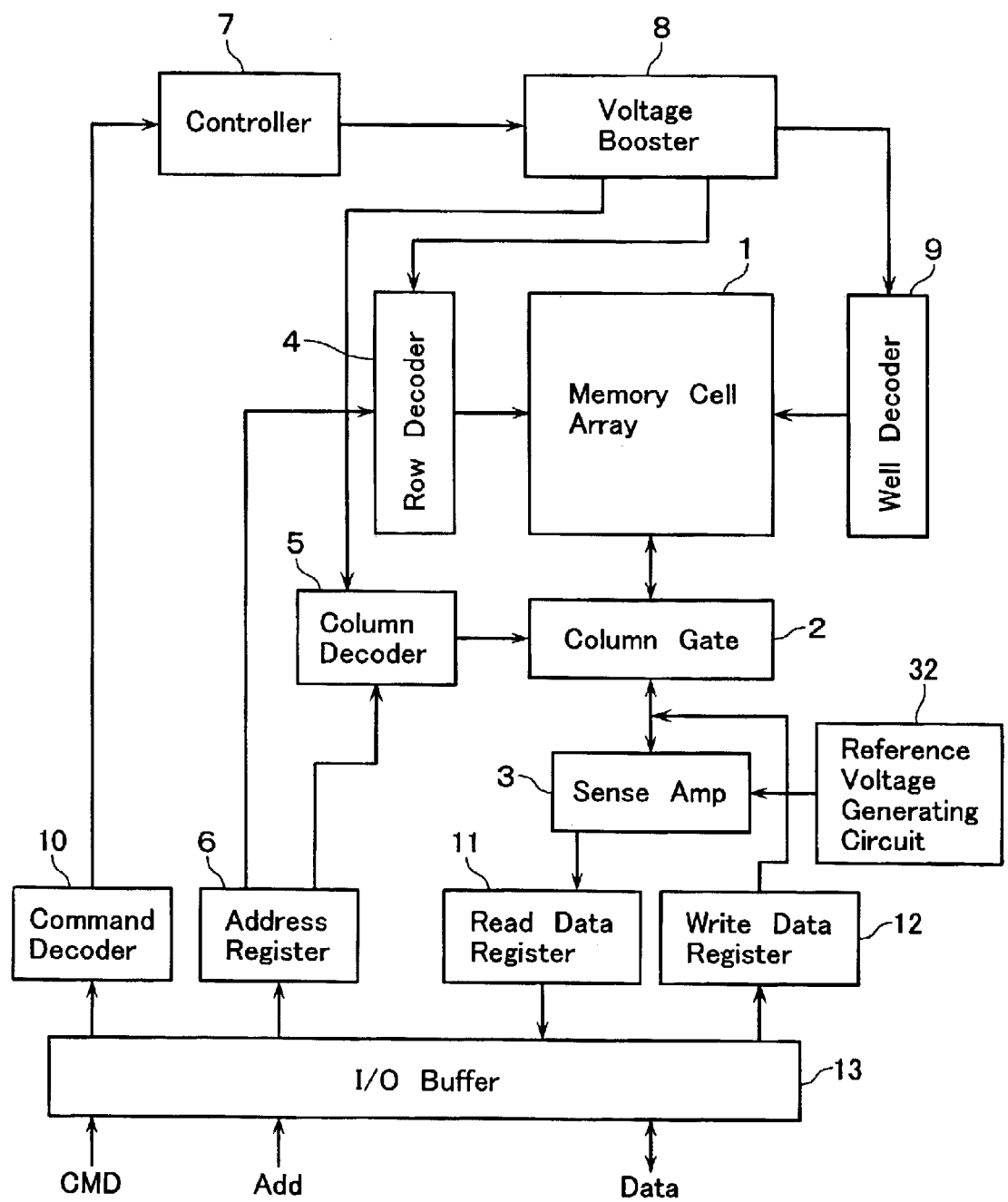
FIG. 1 shows an arrangement of EEPROM according to an embodiment of the present invention.
Figure 3:
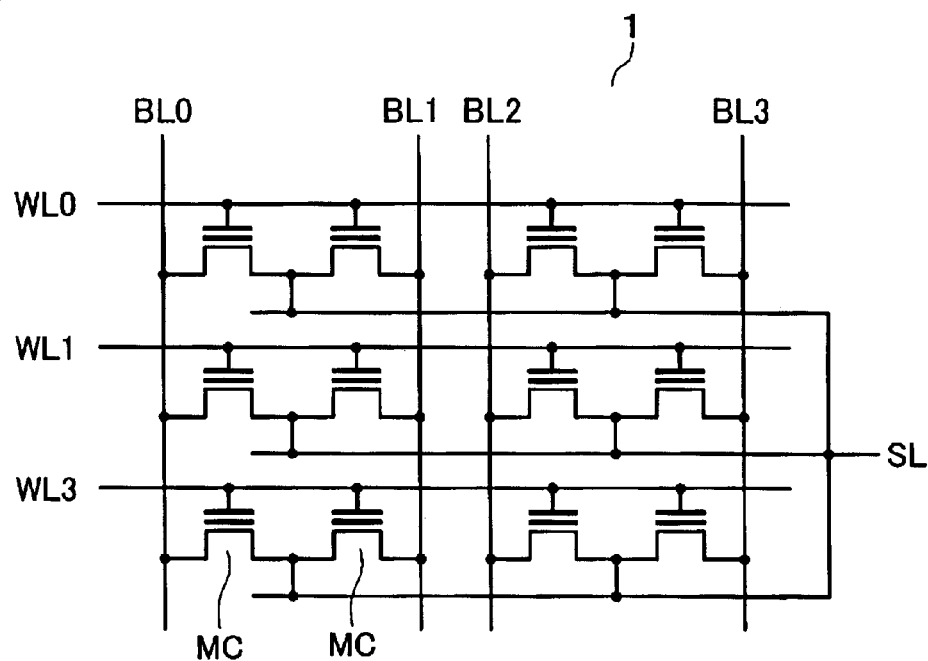
FIG. 3 shows a further specific arrangement of the cell array in the same embodiment.

FIG. 1 shows a block arrangement of the flash memory according to an embodiment of the present invention. A memory cell array 1 comprises multiple word lines WL and bit lines BL intersecting with each other, and memory cells each located at one of the intersections. Specifically, the memory cell array 1 in this embodiment comprises, as shown in FIG. 3, memory cells MC having a stacked-gate MOS transistor structure connected in the NOR form.

A row decoder 4 is provided to select a word line and a column decoder 5 is provided to selectively activate a column gate 2 to select a bit line in the memory cell array 1. As for the address, an internal row address signal and an internal column address signal are transferred through an I/O buffer 13, and through an address register 6, to the row decoder 4 and the column decoder 5, respectively.

Based on a command decoded at a command decoder 10, a controller 7 executes a sequential control such as data writing and erasing. A boosted voltage obtained by boosting a supply voltage is employed for data writing and erasing. For this purpose, a voltage booster 8 is provided, which is controlled by the controller 7 based on an operation mode. The voltage booster 8 supplies its output via the row decoder 4 and the column decoder 5 to the word line WL and the bit line BL. The memory cell array 1 is divided into multiple blocks, each of which is a unit to be erased collectively. A well decoder 9 is provided to control a well potential on each block.

In the memory cell array the bit line selected by the column gate 2 is sensed and amplified at the sense amp 3. A reference voltage generator 32 is provided to supply a reference voltage to the sense amp 3. The data sensed by the sense amp 3 is read out to external through a read data register 11, and through the I/O buffer 13. Write data is loaded into a write data register 12 and, based on the data, data writing into the selected cell is performed.

Figure 2:
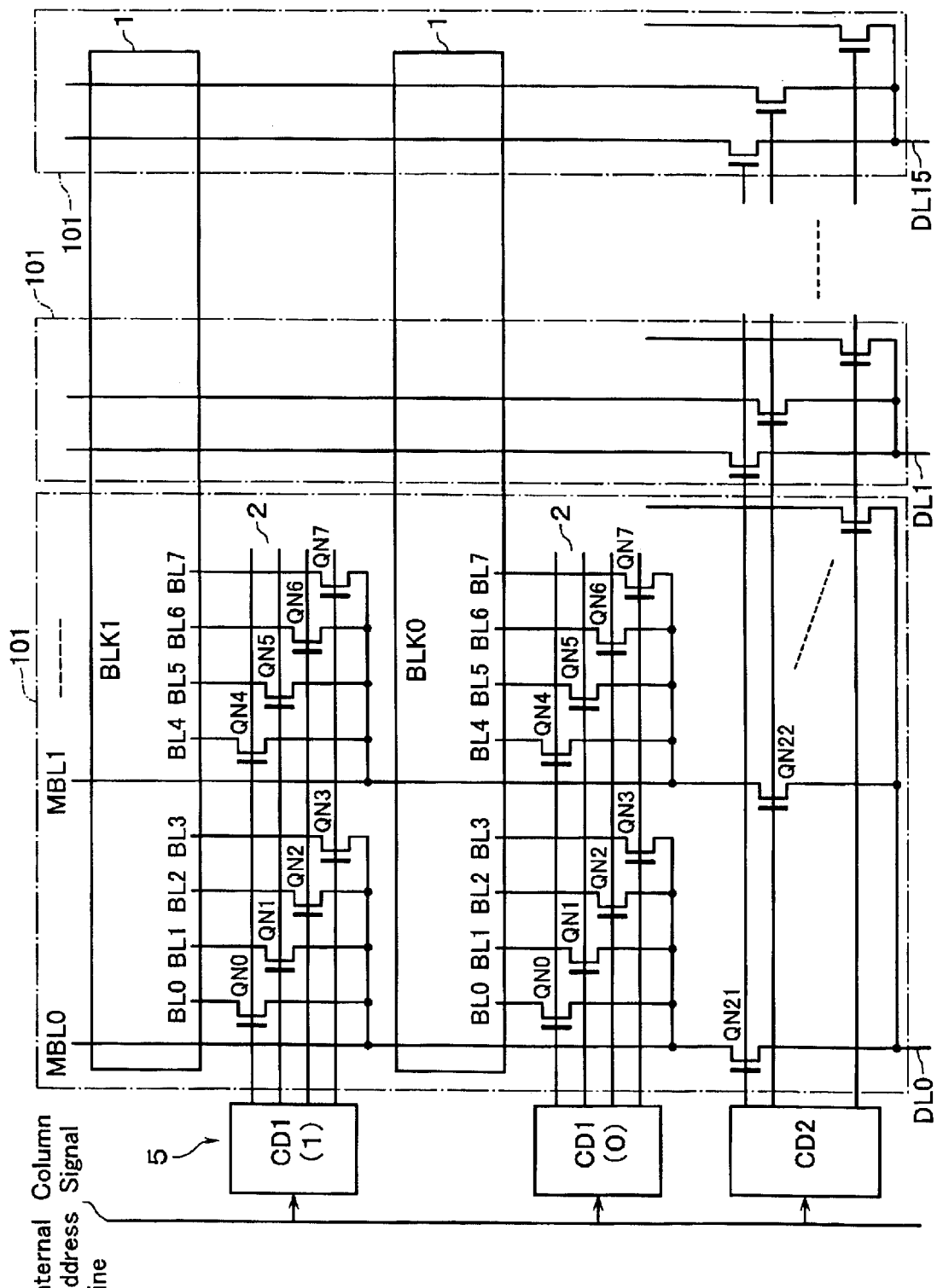
FIG. 2 shows a specific arrangement of the column decoder and cell array sections in the same embodiment.

FIG. 2 shows a specific arrangement of the column decoder 5 and gate 2 and the cell array 1. In this embodiment, explanation is made assuming that the flash memory has 16 bit-wide I/O (see Number 101 in FIG. 2). Accordingly, an unit of readout is 16 bits, and 16 memory cells selected by the column decoder 5 are connected to data lines DL0–DL15 at their drain terminals.

The memory cell array 1 is divided into multiple blocks BLKi, each of which is a unit to erase data. Bit lines BL in each block BLKi are selectively connected, for example, by four, via column gate transistors QN0–QN3, QN4–QN7 and so on to main bit lines MBL0, MBL1 and so on. The column decoder 5 includes a first column decoding circuit CD1 to select a bit line in each block and a second column decoding circuit CD2 to select a main bit line.

The first column decoding circuit CD1 has output lines, or column selection lines, to control gates of the column gate transistors QN0–QN3, QN4–QN7 and so on. The second column decoding circuit CD2 has output lines, or column selection lines, to control gates of column gate transistors QN21, QN22 and so on, which are employed to select a main bit line.

Thus, the selected bit line BL in the selected block is connected to the main bit line MBL, which is then connected to the data line DL.

Figure 4:
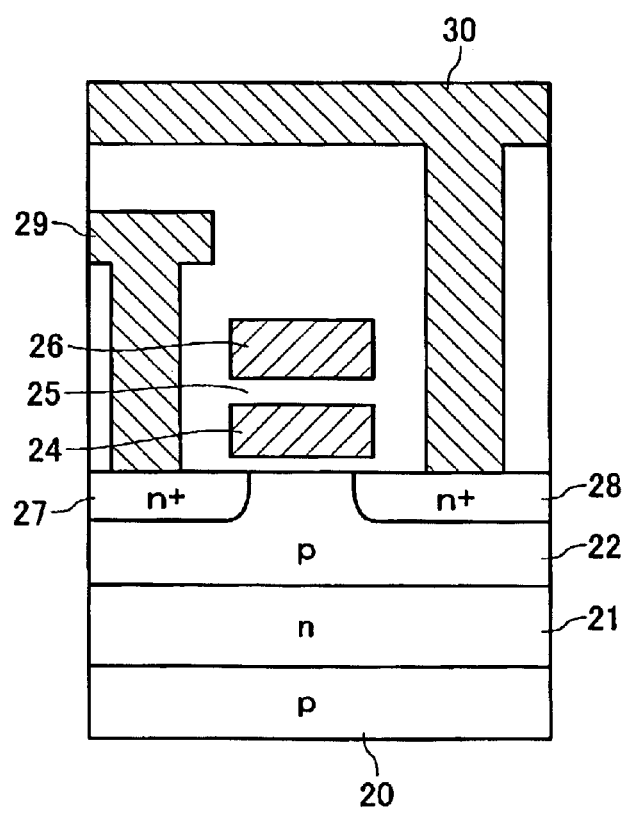
FIG. 4 shows a memory cell structure in the same embodiment.

FIG. 4 shows a structure of the memory cell MC. The memory cell MC is a nonvolatile type and has a stacked MOS transistor structure including a floating gate 24, or a charge storage layer, and a control gate 26. A p-type silicon substrate 20 is employed to form a n-well 21 thereon, a p-well 22 in the n-well 21, and a memory cell MC in the p-well 22.

In the memory cell MC, the floating gate 24 composed of polysilicon is formed on the p-well 22 via a gate insulator 23. The control gate 26 composed of polysilicon is formed on the floating gate 24 via an insulator 25. Source and drain diffusion layers 27, 28 are formed in a manner self-aligned with the control gate 26. The control gate 26 is continuously formed in one direction of a matrix to become a word line WL. The drain diffusion layer 28 is connected to a bit line (BL) 30 and the source diffusion layer 27 to a source line (SL) 29.

The p-well 22 is formed independently in each block that is the unit to erase data collectively as described above. FIG. 3 shows part of the cell array 1 within one block. In the block the word lines WL and the bit lines BL intersect with each other, continuing in the direction. Sources of all memory cells in the block are commonly connected to the source line SL. Accordingly, the bit lines independent in each block are employed as local bit lines, which are selectively connected to the upper main bit line.

The memory cell MC operates as described below. On data writing, the p-well 22 and the source line SL are kept at 0V, a write potential of about 10V is applied to the selected word line WL, and 6V or 0V is applied to the bit line BL in accordance with data "0" or "1". In the memory cell MC given "0" data, a strong lateral electric field across the drain and the source generates hot electrons, which are injected into the floating gate 24. In the case of "1" data, such the electron injection can not occur.

When electrons are injected into the floating gate in such the manner, it turns into a state of "0" with a higher threshold. In the case of "1" data, no hot electrons are generated and accordingly no electrons are injected into the floating gate, which holds an erased state or a state of "1" with a lower threshold.

On data erasing, a collective erasing is performed in each block. In this case, a voltage of about 10V is applied to the p-well 22 and the source line SL in the selected block in addition to the n-well 21, and a voltage of about −7V is applied to all word lines WL in the selected block. As a result, a large electric field is located across the gate insulator 23 in the memory cell within the block to discharge electrons from inside the floating gate by a Fowler-Noldheim current (tunneling current), which yields an erased state of data "1".

On data reading, a reading voltage determined to have a middle value between thresholds for data "0" and "1" is applied to the selected word line, and the presence/absence of a current flowing into the memory cell is determined at the sense amp 3 connected to the bit line.

Figure 5:
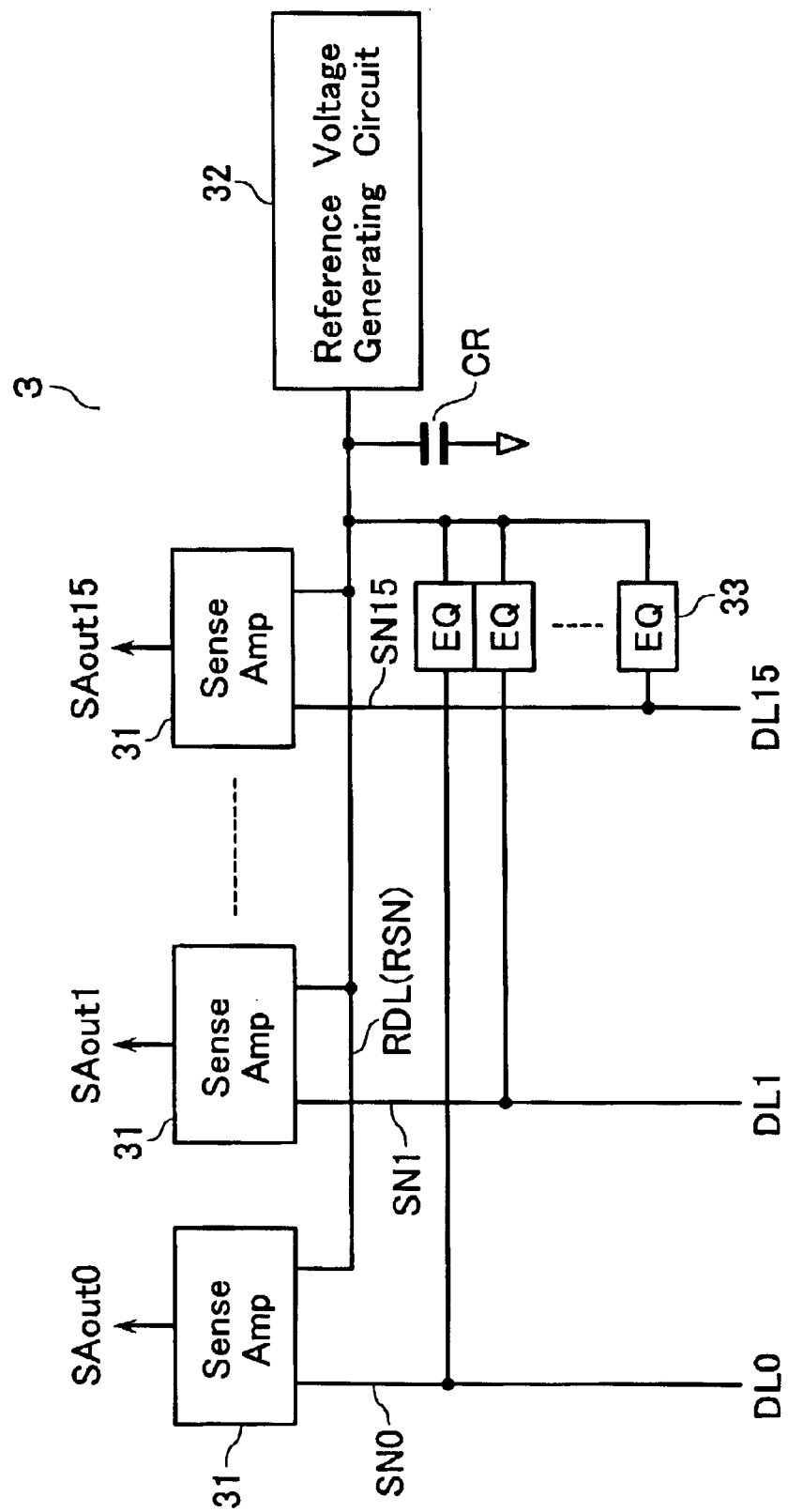
FIG. 5 shows an arrangement of the sense amp circuit in the same embodiment.

FIG. 5 shows the major part of the sense amp circuit 3 connected to the data line DL. The sense amp circuit 3 includes multiple sense amps 31 that have sense lines SN respectively connected to multiple data lines DL0–15, sharing the reference sense line RSN. A reference voltage generator 32 is provided to apply a reference voltage to the reference sense line RSN. Each sense amp 31 compares the readout signal voltage from the sense node SNi(i=0–15) and reference voltage from the reference sense line RSN, amplifies the potential difference, and output it as an output signal SAout0, SAout1 . . . , or SAout15. Also to the reference sense line RSN (or the reference data line RDL), a dummy capacitor CR is connected to balance its capacitance with a larger load capacitance on the data line DL. Between each sense line SN and the reference sense line RSN, an equalizer (EQ) 33 is located to set the sense lines at equipotential prior to the sensing operation.

In the embodiment described above, as shown in FIG. 5, multiple sense amps share the reference sense line. Alternatively, it is applicable to such a system, in which a reference voltage generator is provided in each sense amp.

Figure 6:
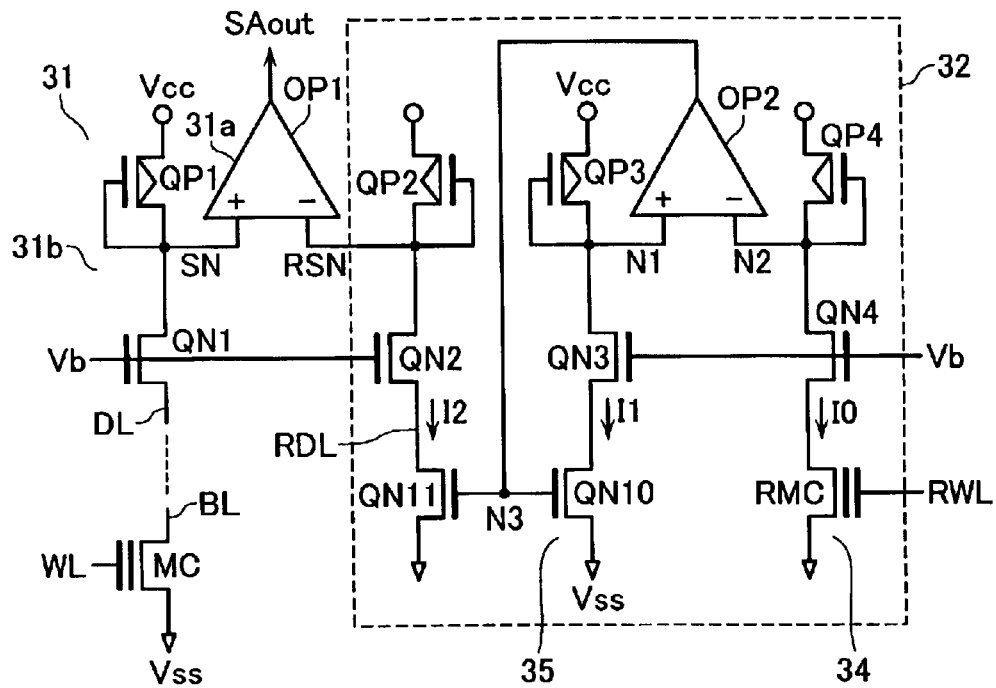
FIG. 6 shows a specific arrangement of the sense amp and the reference voltage generator in the same embodiment.

FIG. 6 shows a specific arrangement of the sense amp 31 and the reference voltage generator 32. The sense amp 31 mainly comprises a differential amp 31a that has two input terminals connected to the sense line SN and the reference sense line RSN, respectively. The sense line SN is connected to a diode-connected current source load PMOS transistor QP1. The sense line SN is also connected to a data line DL via an isolator NMOS transistor QN1 to configure a cascade amp 31b.

The reference voltage generator 32 connected to the reference sense line RSN transfers the reference current flowing through the reference cell RMC to a current source NMOS transistor QN11 to yield a reference voltage. Similar to the memory cell MC, the current source NMOS transistor QN11 is connected via an isolator NMOS transistor QN2 to the reference sense line RSN, which is connected to a diode-connected current source load PMOS transistor QP2.

Similar to the conventional one, the reference cell RMC has the same structure as that of the memory cell MC produced in the same process. The reference cell RMC, however, is formed in a different area from the cell array area for the memory cell MC. The reference cell RMC is provided with functions of writing and erasing not detailed. Therefore, even if a threshold of the reference cell RMC varies in the process steps, the threshold can be adjusted based on a result from the final test.

Similar to the sense amp 31, the reference cell RMC has a drain connected through an isolator NMOS transistor QN4 to one input node N2 (negative input terminal) of the opamp OP2. This node N2 is connected to a diode-connected current source load PMOS transistor QP4. The current path that contains the reference cell RMC configures a reference cell unit 34.

Corresponding to the reference cell unit 34, a reference transistor unit 35 is arranged. It is a current path that contains the reference transistor QN10 to flow the current I1 reflecting the current I0 flowing through the reference cell unit 34. The reference transistor QN10 has a gate connected to the common node N3 together with the gate of the current source NMOS transistor QN11, and a drain connected via an isolator NMOS transistor QN3 to the other input node N1 (positive input terminal) of the opamp OP2. The node N1 is connected to a diode-connected current source load PMOS transistor QP4. The opamp OP2 has an output terminal connected to the node N3. The output from the opamp OP2 is employed to negative feedback control the gate of the reference transistor QN10.

The isolator NMOS transistors QN3 and QN4 in the reference cell unit 34 and the reference transistor unit 35 have the same sizes as those of the isolator NMOS transistors QN1 and QN2 in the sense amp 31 and are given the same gate bias Vb.

In the opamp OP2 of the reference voltage generator 32, when the potential on the node N1 rises, the output shifts to a higher level. In this case, negative feedback control is performed to increase the current flowing through the reference transistor QN10 to lower the potential on the node N1. As a result, the two nodes N1 and N2 are kept at a substantially equipotential. Therefore, in the reference cell unit 34 and the reference transistor unit 35, a size ratio between the current source load PMOS transistors QP3 and QP4 is determined, for example. Thus, the current I1 flowing through the reference transistor unit 35 can be set to have a certain ratio to the current I0 flowing through the reference cell unit 34, similar to the current mirror circuit. The reference transistor QN10 and the current source transistor QN11 connected to the reference sense line RSN substantially configure a current mirror circuit. Therefore, due to a size ratio between them, the current I2 flowing through the current source transistor QN11 has a certain ratio to the current I1 flowing through the reference transistor unit 35.

Specifically, the current I0 flowing through the reference cell RMC is equally set to the ON-cell current Icell, and the current I2 flowing through the current source NMOS transistor QN11 connected to the reference sense line RSN is set to I2=I0/2. This setting is performed as below. First, the current source load PMOS transistor QP4 in the reference cell unit 34 is assumed to have a certain ratio of the channel width W to the channel length L (hereinafter referred to as a W/L ratio). In this case, the current source load PMOS transistor QP3 in the reference transistor unit 35 is designed to ½ the above ratio. This results in I1=I0/2. On the other hand, the reference transistor QN10 and the current source transistor QN11 are designed to have the same W/L ratio. As a result, the current flowing through the current source transistor QN11 connected to the reference sense line RSN in the sense amp 31 comes to I2=I1=I0/2=Icell/2.

Alternatively, the load PMOS transistors QP4 and QP3 in the reference cell unit 34 and the reference transistor unit 35 are designed to have the same W/L ratio. This results in I1=I0. The current source transistor QN11 is designed to have a W/L ratio equal to ½ the W/L of the reference transistor QN10. As a result, the current flowing through the current source transistor QN11 connected to the reference sense line RSN in the sense amp 31 comes to I2=I1/2=I0/2=Icell/2.

Alternatively, the isolator NMOS transistors QN4 and QN3 in the reference cell unit 34 and the reference transistor unit 35 are designed to have an adjusted size ratio between them. As a result, it is also possible to set the current flowing through the current source transistor QN11 to I2=Icell/2.

As obvious from the above, in the reference voltage generator 32 according to this embodiment, the output from the opamp OP2 is employed to control the gate of the reference transistor QN10 to keep the nodes N1, N2 at equipotential. This negative feedback control enables the reference transistor QN10 to flow a constant current through it. In the conventional reference voltage generator circuitry that employs the current mirror circuit, the reference transistor in the reference transistor unit is required to operate as a pentode to eliminate the dependency on the power supply. This requirement adds constrains to achievement of a lower Vccmin. To the contrary, the reference transistor QN10 in this embodiment is controlled by the opamp OP2 to flow a constant current, leaving no constrains to operate as a pentode. As a result, different from the conventional reference voltage generator, it is possible to work at a much lower Vccmin. In other words, associated with the lowered supply voltage, if the sense amp 31 is configured in the direct-sensing type by removing the isolators, the reference voltage generator has no restrictions on the lowered supply voltage. Such examples will be described later.

Figure 7:
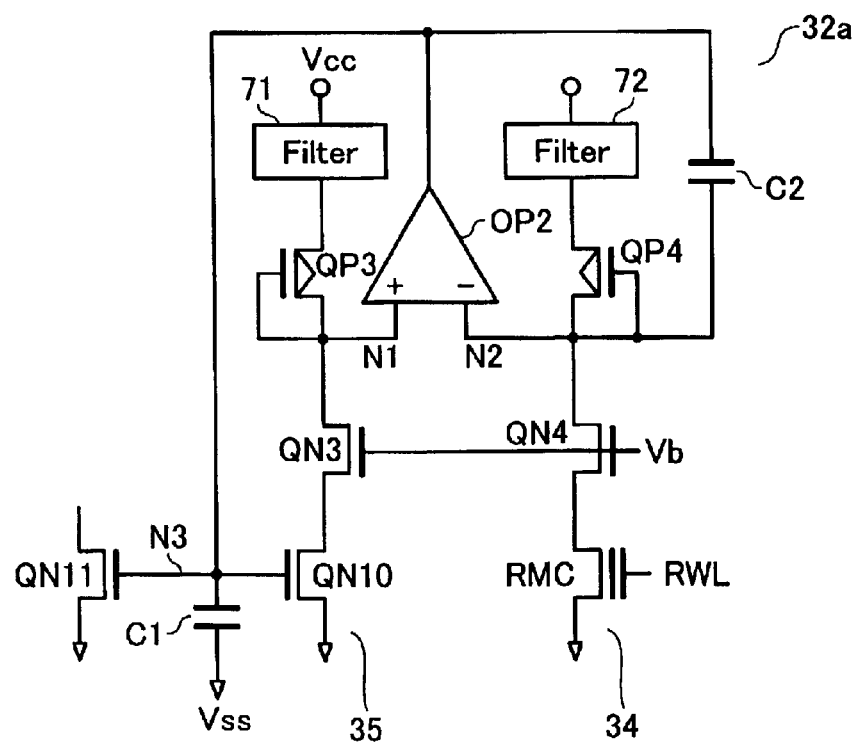
FIG. 7 shows a modified embodiment of the reference voltage generator in FIG. 6.

FIG. 7 shows an arrangement of a reference voltage generator 32b that includes oscillation inhibitors added to the reference voltage generator 32 described in the embodiment of FIG. 6. Between the output terminal and the input node N2 of the opamp OP2, a stabilizing capacitor C2 is connected to prevent positive feedback operations. The common gate node N3 of the reference transistor QN10 and current source transistor QN11 easily suffers noises caused from rapid charging and discharging of the reference line RSN and others. Then, a capacitor C1 is connected also to the node N3 to reduce the influence from noises. Between the current source load PMOS transistors QP3, QP4 and the power terminal, filters 71, 72 are interposed to reduce the influence from power supply noises.

Figure 8:
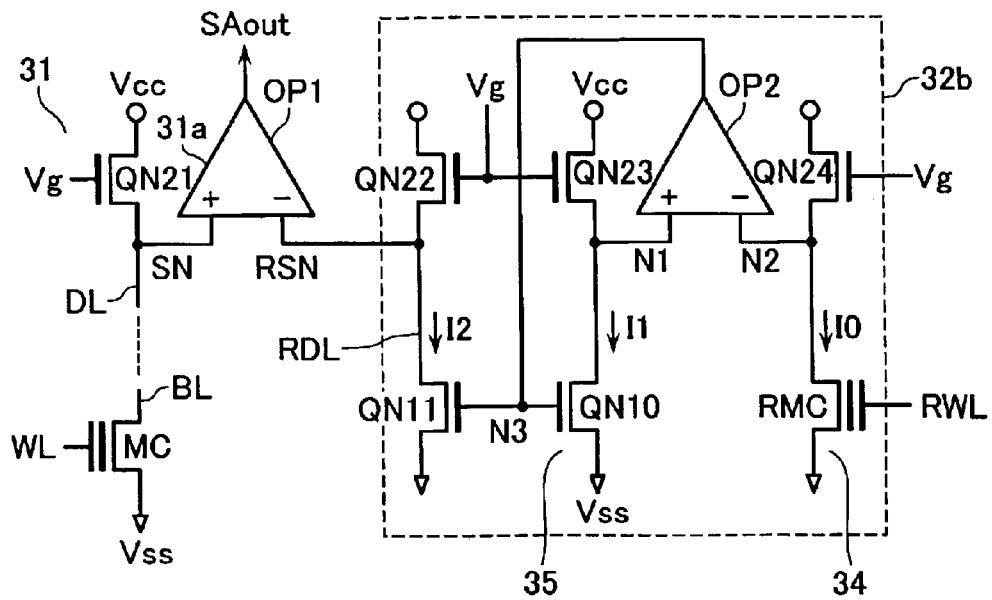
FIG. 8 shows an arrangement of the sense amp and the reference voltage generator according to another embodiment.

FIG. 8 shows an embodiment of the sense amp 31 of the bit-line direct-sensing type, in which the parts corresponding to those in the embodiment of FIG. 6 are given the same reference alphanumerics and their detailed description is omitted. The sense amp 31 includes no isolators, and the sense line SN is directly connected to the bit line BL through the data line DL and the reference sense line RSN is directly connected to the reference data line RDL. In order to suppress potential elevations on the sense line SN and the reference sense line RSN, NMOS transistors QN21, QN22 are employed as the current source loads connected to these lines, and their gates are driven with a certain bias Vg. The potential elevations on the sense line SN and the reference sense line RSN can be held at Vg-Vtn, where Vth denotes a threshold of the NMOS transistors QN21, QN22. Thus, the NMOS transistors QN21, QN22 have clamp functions to suppress the bit line potential.

Corresponding to the sense amp 31 that applies the bit-line direct-sensing type, the reference voltage generator 32b also includes no isolators and connects the input nodes N1, N2 of the opamp OP2 directly to the drains of the reference NMOS transistor QN10 and the reference cell RMC, respectively. The current source loads in the reference cell unit 34 and the reference transistor unit 35 formed at the nodes N1, N2 comprise NMOS transistors QN23, QN24 given a certain gate bias Vg, similar to the sense amp 31.

The output from the opamp OP2 is employed to feedback control the gate of the reference NMOS transistor QN10 to keep the nodes N1, N2 at equipotential, similar to the embodiment in FIG. 6.

Also in this embodiment, the reference cell RMC is produced to have the same structure as that of the memory cell MC in the same process steps and to flow the current Icell similar to the ON-cell current. Thus, a device size in the reference voltage generator 32b is designed in such a manner that the current I2 flowing through the current source transistor QN11 can be set to ½ the ON-cell current Icell. For example, a W/L ratio of the current source NMOS transistor QN23 is designed to ½ the current source NMOS transistor QN24. Thus, the current I1 flowing through the reference transistor unit 35 can be set to ½ the current I0 flowing through the reference cell unit 34. If the reference transistor QN10 has the same size as that of the current source transistor QN11, the current I2 flowing through the current source NMOS transistor QN11 comes to I2=I1=I0/2=Icell/2.

Alternatively, the current source NMOS transistor QN23 is designed to have the same W/L ratio as that of the current source NMOS transistor QN24, and a W/L ratio of the current source NMOS transistor QN11 is designed to ½ that of the reference NMOS transistor QN10. As a result, the current I2 flowing through the current source NMOS transistor QN11 can be set to I2=I1/2=I0/2=Icell/2.

If the bit-line direct-sensing scheme is employed like this embodiment, Vccmin for the sense amp 31 can be lowered, as described in the prior art. If the reference voltage generator 32b is formed in the same type as the sense amp 31 to feedback control the gate of the reference NMOS transistor QN10 from the control amp, the reference voltage generator 32b can also operate at a lower Vccmin, similar to the sense amp 31.

Also in this embodiment, the current source load NMOS transistors QN21, QN22, QN23, QN24 have the clamp function to suppress the elevation of the potential on the bit line as described above. Though, if the supply voltage is lowered, compared to the reference transistor QN10 and the current source transistor QN11, a lower threshold transistor may be employed. For example, the use of a transistor with a threshold voltage of 0V allows the operation to be performed at a much lower supply voltage. In this case, the lower threshold voltage transistor can be produced using a mask to prevent the ion injection during the step of channel ion injection into other NMOS transistors.

Figure 9:
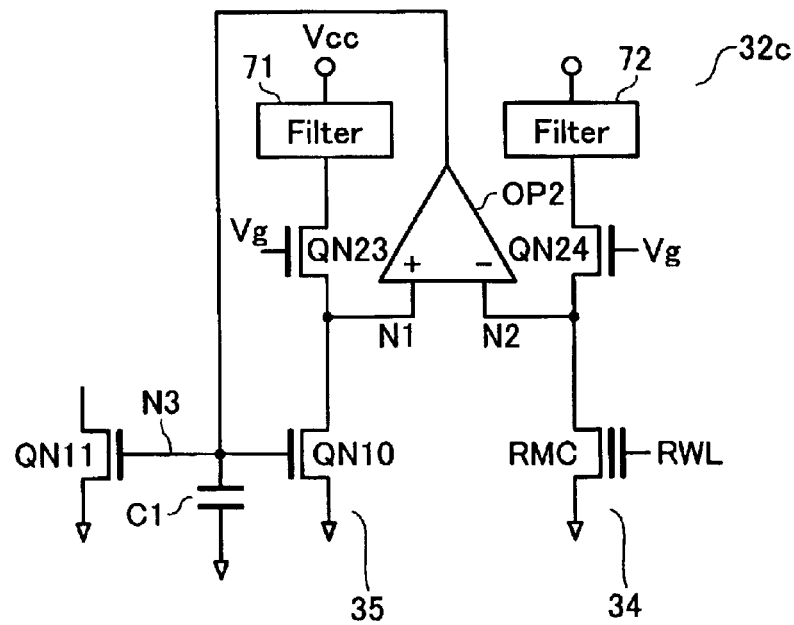
FIG. 9 shows a modified embodiment of the reference voltage generator in FIG. 8.

FIG. 9 shows an arrangement of a reference voltage generator 32c that includes oscillation inhibitors added to the reference voltage generator 32b in the embodiment of FIG. 8. A stabilizing capacitor C1 is connected to the common gate node N3 of the reference transistor QN10 and current source transistor QN11. Between the current source load NMOS transistors QN23, QN24 and the power terminal, filters 71, 72 are interposed to enable a stabilized operation to be performed with a reduced influence from noises.

Figure 10:
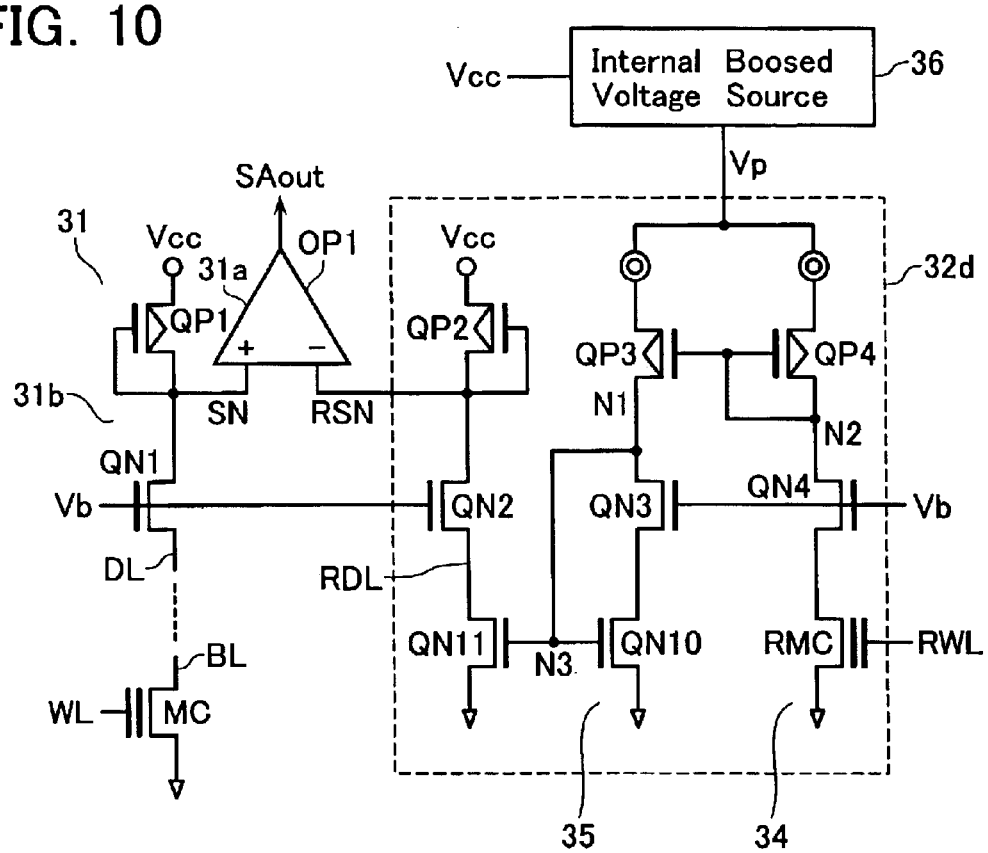
FIG. 10 shows an arrangement of the sense amp and the reference voltage generator according to another embodiment.

FIG. 10 shows an arrangement of the sense amp 31 and a reference voltage generator 32d according to another embodiment. The sense amp 31 has the same arrangement as that in the embodiment of FIG. 6. Different from the previous embodiments, the reference voltage generator 32d employs the same arrangement as the conventional type fundamentally shown in FIG. 18. In a word, the current source load PMOS transistors QP3, QP4 in the reference cell unit 34 and the reference transistor unit 35 are designed to configure a current mirror circuit. In this case, the power supply given to the sources of the current source load PMOS transistors QP3, QP4 is equal not to Vcc but to an internal boosted-voltage Vp that is boosted from Vcc by an internal boosted-voltage source 36.

Preferably, the current source load PMOS transistors QP3, QP4 provided with the internal boosted-voltage source may comprise high breakdown voltage transistors, which are different from the Vcc series transistors in a well structure, a junction structure, and a gate oxide thickness. If the internal boosted-voltage source is employed in the reference voltage generator 32d like this example, the need for the reference transistor QN10 to operate as a pentode requires no reason that Vccmin can not be lowered in the reference voltage generator compared to the sense amp. Therefore, Vccmin is not determined from the reference voltage generator and the operation can be performed at a lower Vccmin.

Figure 11:
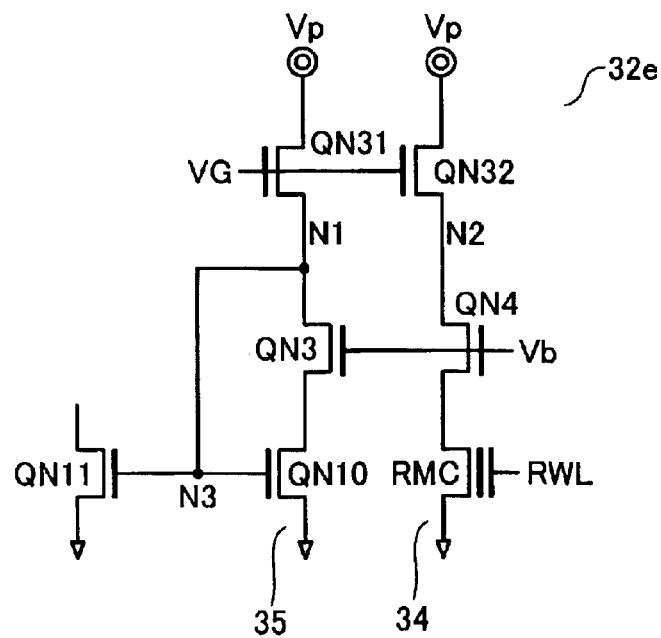
FIG. 11 shows a modified embodiment of the reference voltage generator in FIG. 10.

FIG. 11 shows a modified embodiment of the reference voltage generator 32d according to the embodiment of FIG. 10. The reference voltage generator 32e employs NMOS transistors QN31, QN32 given a certain gate bias VG as the current source loads. The NMOS transistors QN31, QN32 comprise high-voltage transistors because the boosted-voltage Vp is applied to them. The selection of the gate bias VG can set the voltage on the nodes N1, N2 to VG-Vth (Vth denotes a threshold voltage of the NMOS transistors QN31, QN32). This is effective to prevent a high voltage to be applied to the isolator transistors QN3, QN4 down.

Figure 12:
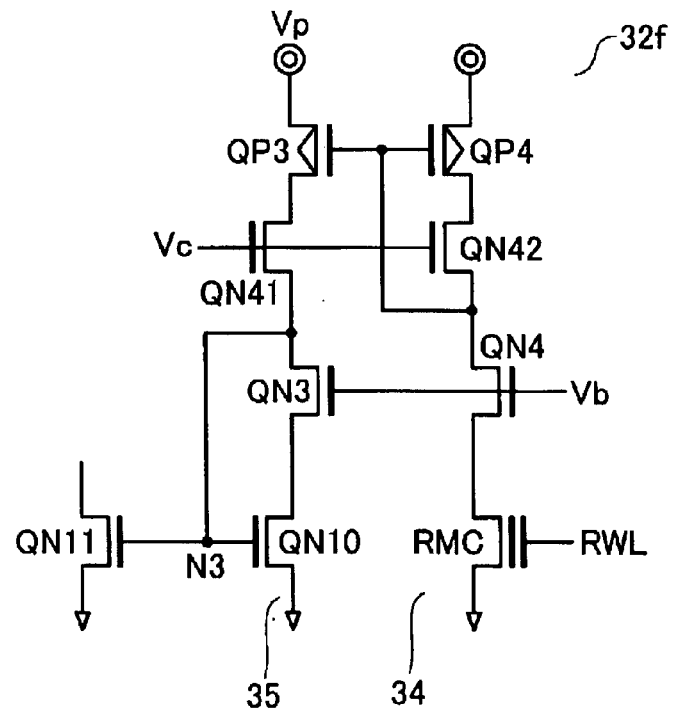
FIG. 12 shows another modified embodiment of the reference voltage generator in FIG. 10.

FIG. 12 shows a reference voltage generator 32f designed to modify the reference voltage generator 32d of FIG. 10 so as to prevent a high voltage to be applied to the isolators down. Between the current source load PMOS transistors QP3, QP4 and the isolator transistors QN3, QN4, clamper NMOS transistors QN41, QN42 are interposed. A certain bias Vc is applied to gates of the clamper NMOS transistors QN41, QN42 to prevent a high voltage to be transferred to the isolators down.

Figure 13:
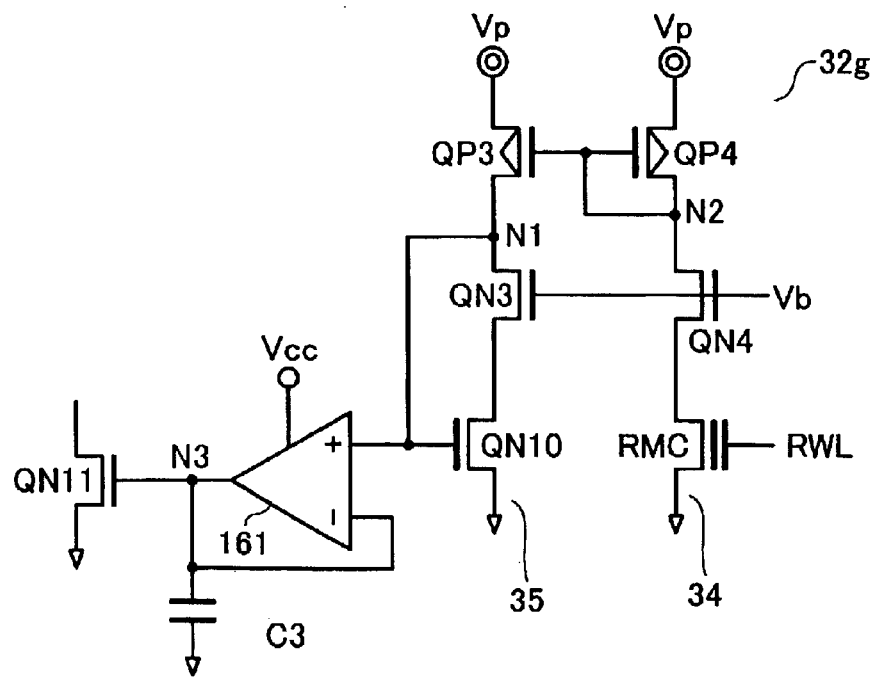
FIG. 13 shows another modified embodiment of the reference voltage generator in FIG. 10.

The gate node N3 of the current source transistor QN11 has a relatively large capacitance, which allows a large current to flow at the time of set-up. The internal boosted-voltage source 36 can not have a very large current driving ability. Accordingly, if the internal boosted-voltage source 36 is employed as in the embodiment of FIG. 10, the lowered internal boosted-voltage Vp may possibly cause a problem. FIG. 13 shows a reference voltage generator 32g designed to modify the reference voltage generator 32d of FIG. 10 in consideration of this point. A voltage follower buffer 161 is interposed between the node N2, the gate of the reference transistor QN10, and the gate of the current source transistor QN11. This buffer 161 is driven with the power supply Vcc to prevent the internal boosted-voltage Vp to be lowered.

The schemes described in FIGS. 10–13 that employ the internal boosted-voltage source in the reference voltage generator can be also applied to the bit-line direct-sensing scheme without isolators. In this case, NMOS transistors are employed as the current source loads in the sense amp 31 and the current source loads in the reference voltage generator, and a certain gate bias is applied to them to achieve clamp functions, similar to the embodiment described in FIG. 8.

Figure 14A:
FIGS. 14A, 14B and 14C show another arrangements of the current source load in the sense amp.
Figure 14B:
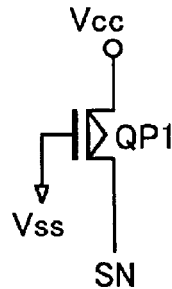

In the embodiments previously described, for example, the diode-connected PMOS transistor is employed as the current source load in the sense amps 31 of FIGS. 6, 7, 10 and 11. Alternatively, other loads may be employed. As for the sense line SN, a resistor R shown in FIG. 14A and a PMOS transistor having a gate grounded to Vss as shown in FIG. 14B may be employed, for example. Ditto for the reference sense line RSN.

Figure 14C:
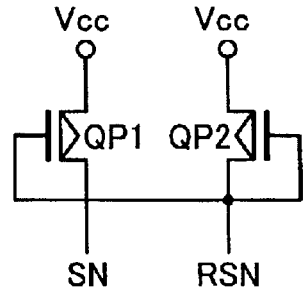

Alternatively, as shown in FIG. 14C, the gate of the current source load PMOS transistor QP1 on the sense line SN may be controlled from the reference sense line RSN.

Figure 15A:
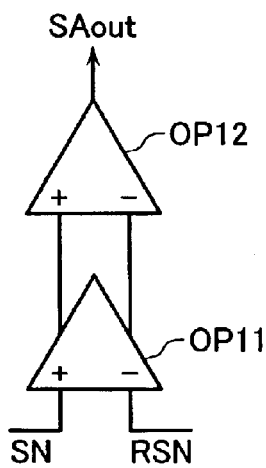
FIGS. 15A, 15B, 15C and 15D show another arrangements of the sense amp body.
Figure 15B:
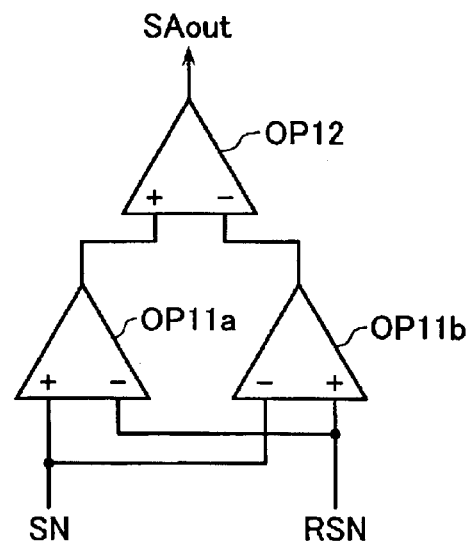

The arrangement of the sense amp body in the previous embodiments may also be modified variously. For example, as shown in FIG. 15A, two-stage opamps OP11, OP12 may be connected in tandem. Alternatively, as shown in FIG. 15B, opamps OP11a and OP11b are connected to the sense line SN and the reference sense line RSN, respectively, to obtain outputs with opposite polarities. In addition, an opamp OP12 is provided to obtain a difference between the outputs.

Figure 15C:
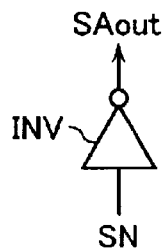
Figure 15D:
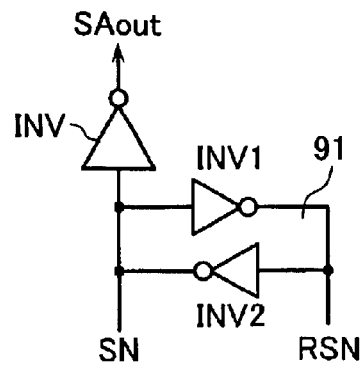

If the load arrangement as shown in FIG. 14C is employed, the sense amp body may comprise an inverter INV as shown in FIG. 15C. Alternatively, as shown in FIG. 15D, a flip-flop 91 including parallel inverters INV1, INV2 inversely connected may be employed as the sense amp body.

Figure 16A:
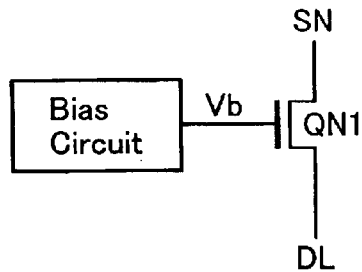
FIGS. 16A and 16B show arrangements of the isolator.
Figure 16B:
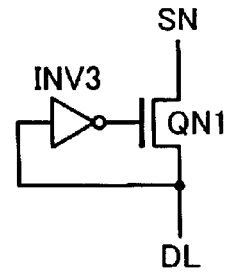

In the previous embodiments, as shown in FIG. 16A, the NMOS transistor given a fixed gate bias Vb from a bias circuit is employed as the isolator. In contrast, as shown in FIG. 16B, the isolator may be configured using a NMOS transistor, of which source potential is fed back to its gate through an inverter INV3, similarly both in the sense amp and the reference voltage generator.

The sense amp circuitry that employs the reference voltage generator described above can be applied to various semiconductor memories other than EEPROM, which store data in accordance with the presence/absence or large/small of a current flowing into them.

Figure 17:
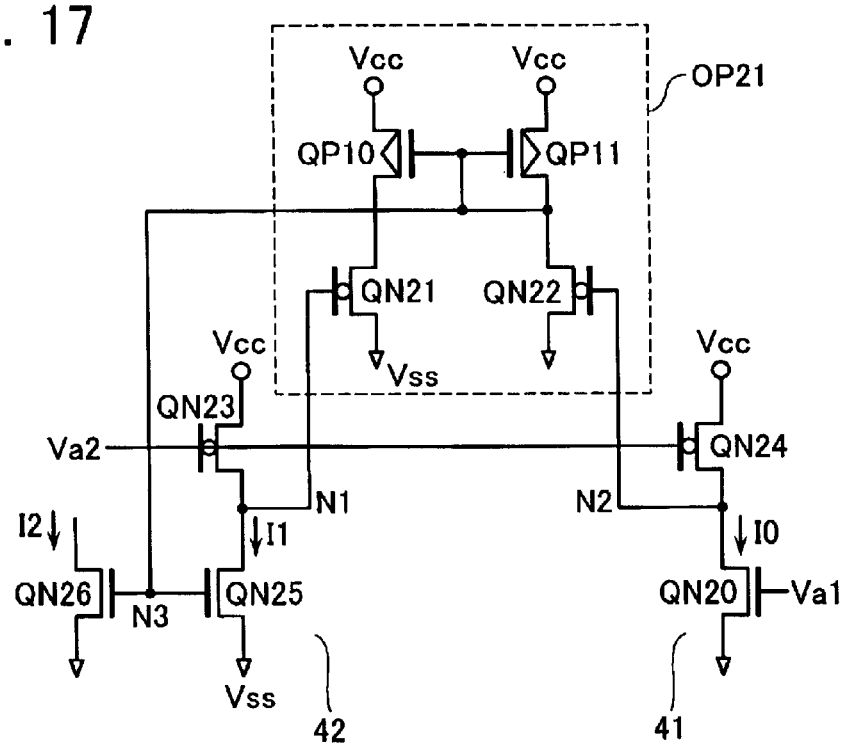
FIG. 17 shows an embodiment of the current mirror circuit according to the present invention.

The arrangement principle of the reference voltage generators 32, 32a, 32b, 32c described in the embodiments of FIGS. 6–9 can be applied generally as a current mirror circuit in addition to the reference voltage generation for the sense amp in the semiconductor memory. Such an embodiment of the current mirror circuit is shown in FIG. 17.

This current mirror circuit includes a NMOS transistor QN20 as a reference current source transistor and, based on the reference current I0 flowing through it when a certain gate bias Va1 is applied, intends to generate a constant current I2 flowing into an output current source NMOS transistor QN26. A current source NMOS transistor QN24 is connected to a drain of the reference current source NMOS transistor QN20 to configure a first current path 41. Similarly, a current source NMOS transistor QN23 is connected serially to a NMOS transistor QN25 to configure a second current path 42 in parallel with the current path 41.

A constant bias Va2 is commonly given to gates of the load NMOS transistors QN23, QN24. In order to lower the supply voltage, the load NMOS transistors QN23, QN24 may comprise such transistors that have a lower threshold than other NMOS transistors QN20, QN25 and QN26, for example, a threshold voltage of 0V. This can be achieved easily if a mask is employed during the step of channel ion injection into the NMOS transistors QN20, QN25, QN26 and the like. The nodes N2, N1 on the two current paths 41, 42 are connected to the negative and positive input terminals of the opamp OP21, respectively. In order to lower the supply voltage, NMOS transistors QN21, QN22 in the opamp OP21 may comprise transistors that have a lower threshold, for example, a threshold voltage of 0V.

The positive output from the opamp OP21 is fed back to the gate of the NMOS transistor QN25, which is connected to the gate of the output current source NMOS transistor QN26.

Similar to the reference voltage generator as described in the previous embodiments, this current mirror circuit employs the opamp OP21 to negative feedback control the transistor QN25 so that the nodes N2, N1 on the two current paths 41, 42 are kept at equipotential. Therefore, if the load NMOS transistors QN23, QN24 have the same size, the current I1 flowing through the current path 42 has the same value as the current I0 flowing through the current path 41. The NMOS transistors QN25 and QN26 have gates that are commonly driven. Therefore, if they have the same size, the current I2 flowing through the output current source NMOS transistor QN26 has the same value as the current I1 on the current path 42. In a word, based on the reference current source I0, an output current, I2=I1=I0, can be obtained. As described in the reference voltage generator of the previous embodiments, the selection of each transistor size enables the output current I2 having a predetermined ratio to the reference current I0 to be obtained.

Figure 18:
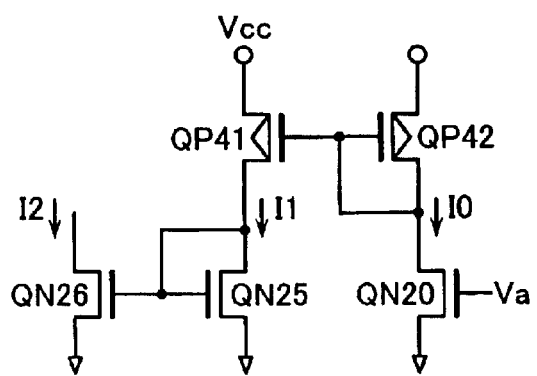
FIG. 18 shows an arrangement of the conventional current mirror circuit.
Figure 19:
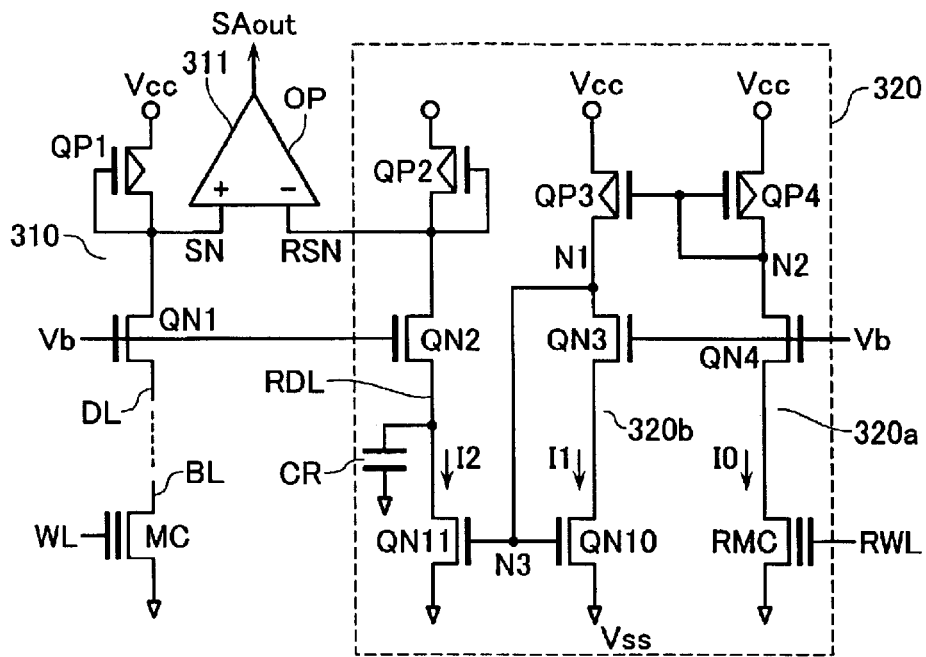
FIG. 19 shows an arrangement of the conventional sense amp circuit.
Figure 20:
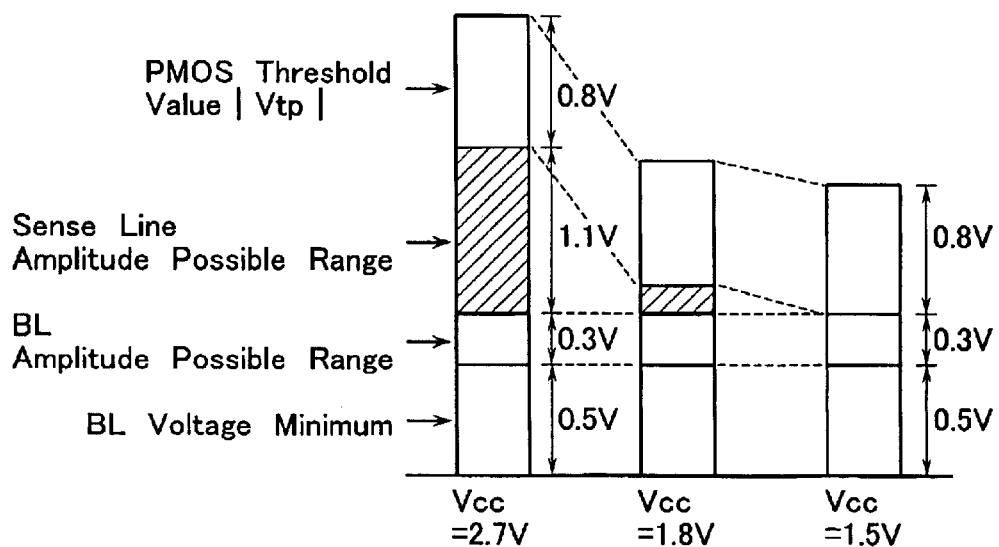
FIG. 20 illustrates the workable ranges of the sense amp associated with the lowered supply voltage.

The usability of the current mirror circuit according to this embodiment is described in comparison with the corresponding current mirror circuit in the art shown in FIG. 18. In the conventional current mirror circuit shown in FIG. 18, the gate-drain connected NMOS transistor QN25 can perform a stable operation without dependency on the power supply if it is biased into a pentode region together with its load PMOS transistor QP41. In this case, Vccmin comes to Vccmin=Vth+|Vtp|, where Vtn denotes a threshold of a NMOS transistor and Vtp a threshold of a PMOS transistor. Therefore, if Vtn=1V and Vtp=−0.3V, then Vccmin=1.3V. Accordingly, it can operate at Vcc=about 2V but the stable operation can not be ensured at 1.3V or below.

To the contrary, in the circuit of FIG. 17, the current flowing through the NMOS transistor QN25 is controlled by the opamp OP21. Therefore, no restriction is present to bias it into the pentode operation region to eliminate the dependency on the power supply. Further, if the load NMOS transistor QN23 is designed to have a threshold as low as 0V, for example, when the supply voltage is lowered, Va2=Vcc, it is sufficient to keep a drain-source voltage just required to flow a drain current into the load NMOS transistor QN23. Therefore, it is possible to operate at Vccmin of 1.3V or below.

As obvious from the forgoing, according to the present invention, through the improvement in the reference voltage generator, it is possible to provide a semiconductor memory device using a sense amp circuitry capable of lowering a supply voltage easily.

Having described the embodiments consistent with the invention, other embodiments and variations consistent with the invention will be apparent to those skilled in the art. Therefore, the invention should not be viewed as limited to the disclosed embodiments but rather should be viewed as limited only by the spirit and scope of the appended claims.

What is claimed is:

1. A semiconductor memory device, comprising:
    an array of memory cells each configured to store data in accordance with the presence/absence or the magnitude of a current;
    a sense amp configured to compare a voltage caused on a sense line based on data in a memory cell selected from said array of memory cells with a reference voltage applied to a reference sense line to determine said data; and
    a reference voltage generator configured to generate said reference voltage applied to said reference sense line, said reference voltage generator including:
        a reference cell unit containing a reference cell to flow a reference current as a reference for determination of data in said memory cell, and a first current source load to supply a current to said reference cell;
        a reference transistor unit containing a reference transistor to flow a current reflecting said reference current, and a second current source load to supply a current to said reference transistor;
        a control amp having a first input terminal connected to a first connection node between said reference cell and said first current source load, a second input terminal connected to a second connection node between said reference transistor and said second current source load, and an output terminal connected to a gate of said reference transistor to negative feedback control said reference transistor;
        a current source transistor having a gate commonly connected to said gate of said reference transistor, and a drain connected to said reference sense line from said sense amp; and
        a third current source load connected to said reference sense line.

2. The semiconductor memory device according to claim 1, said sense amp including:
    a fourth current source load operative to supply a current to a memory cell through a bit line connected to said sense line; and
    a sense amp body configured to sense a voltage between said sense line and said reference sense line.

3. The semiconductor memory device according to claim 2, wherein said third and fourth current source loads are composed of PMOS transistors, further comprising an isolator interposed between said sense line and said bit line connected to said sense line, and an isolator interposed between said reference sense line and said current source transistor,
    and wherein said first and second current source loads are composed of PMOS transistors, further comprising an isolator interposed between said first connection node and said reference cell, and an isolator interposed between said second connection node and said reference transistor.

4. The semiconductor memory device according to claim 2, wherein said third and fourth current source loads are composed of NMOS transistors given a certain gate bias, and said sense line and said reference sense line are directly connected to said bit line and said current source transistor, respectively,
    and wherein said first and second current source loads are composed of NMOS transistors given a certain gate bias, and said first connection node and said second connection node are directly connected to said reference cell and said reference transistor, respectively.

5. The semiconductor memory device according to claim 1, wherein said reference voltage generator includes an oscillation inhibitor.

6. The semiconductor memory device according to claim 1, wherein said memory cell comprises an electrically rewritable, nonvolatile memory cell having a MOS transistor structure including a charge storage layer and a control gate, and said reference cell has the same structure as that of said memory cell produced in the same process.

7. The semiconductor memory device according to claim 1, wherein at least one of a size ratio of said first current source load to said second current source load and a size ratio of said reference transistor to said current source transistor is adjusted to optimally determine a ratio of a reference current flowing through said reference cell unit to a current flowing through said current source transistor.

8. A semiconductor memory device, comprising:
   an array of memory cells each configured to store data in accordance with the presence/absence or the magnitude of a current;
   a sense amp configured to compare a voltage caused on a sense line based on data in a memory cell selected from said array of memory cells with a reference voltage applied to a reference sense line to determine said data; and
   a reference voltage generator configured to generate said reference voltage applied to said reference sense line, said reference voltage generator including:
      a reference cell unit containing a reference cell to flow a reference current as a reference for determination of data in said memory cell, and a first current source load connected to an internal boosted-voltage source to supply a current to said reference cell;
      a reference transistor unit containing a reference transistor to flow a current reflecting said reference current, and a second current source load connected to said internal boosted-voltage source to supply a current to said reference transistor, said reference transistor having a gate connected to a connection node between said second current source load and said reference transistor;
      a current source transistor having a gate commonly connected to said gate of said reference transistor, and a drain connected to said reference sense line from said sense amp; and
      a third current source load connected to said reference sense line to supply a current to said current source transistor.

9. The semiconductor memory device according to claim 8, said sense amp including:
   a fourth current source load configured to supply a current to a memory cell through a bit line connected to said sense line; and
   a sense amp body configured to sense a voltage between said sense line and said reference sense line.

10. The semiconductor memory device according to claim 9, wherein said third and fourth current source loads are composed of PMOS transistors, further comprising an isolator interposed between said sense line and said bit line connected to said sense line, and an isolator interposed between said reference sense line and said current source transistor, and wherein said first and second current source loads are composed of PMOS transistors configuring a current mirror circuit, further comprising an isolator interposed between said first current source load and said reference cell, and an isolator interposed between said second current source load and said reference transistor.

11. The semiconductor memory device according to claim 8, wherein said first and second current source loads in said reference voltage generator are composed of NMOS transistors given a certain gate bias.

12. The semiconductor memory device according to claim 8, further comprising a voltage follower operative at a supply voltage interposed between said gate of said reference transistor and said gate of said current source transistor.

13. A current mirror circuit, comprising:
   a first current path containing a reference current source transistor given a certain gate bias to flow a reference current, and a first current source load connected to a drain of said reference current source transistor;
   a second current path containing a reference transistor to flow a current in response to said reference current, and a second current source load connected to a drain of said reference transistor;
   a control amp having a first input terminal connected to said drain of said reference transistor, a second input terminal connected to said drain of said reference current source transistor, and an output terminal connected to a gate of said reference transistor to negative feedback control said reference transistor; and
   an output current source transistor having a gate commonly connected to said gate of said reference transistor.

14. The current mirror circuit according to claim 13, wherein said reference current source transistor, said reference transistor and said output current source transistor are composed of NMOS transistors, and said first and second current source loads are composed of NMOS transistors given a certain gate bias.

15. The current mirror circuit according to claim 13, wherein said first and second current source loads are composed of transistors having lower threshold voltages than those of said reference current source transistor and said reference transistor.

16. The current mirror circuit according to claim 15, wherein said control amp comprises an opamp with a differential input stage composed of transistors having lower threshold voltages than those of said reference current source transistor and said reference transistor.

* * * * *